US010032864B2

(12) United States Patent
Min et al.

(10) Patent No.: US 10,032,864 B2
(45) Date of Patent: Jul. 24, 2018

(54) SEMICONDUCTOR DEVICE HAVING FIELD INSULATION LAYER BETWEEN TWO FINS

(71) Applicant: SAMSUNG ELECTRONICS CO., LTD., Suwon-si, Gyeonggi-do (KR)

(72) Inventors: Kyung Seok Min, Yongin-si (KR); Mi Gyeong Gwon, Seoul (KR); Seong Jin Nam, Seongnam-si (KR); Sug Hyun Sung, Yongin-si (KR); Young Hoon Song, Suwon-si (KR); Young Mook Oh, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/292,515

(22) Filed: Oct. 13, 2016

(65) Prior Publication Data

US 2017/0194426 A1 Jul. 6, 2017

(30) Foreign Application Priority Data

Jan. 6, 2016 (KR) .................. 10-2016-0001535

(51) Int. Cl.
*H01L 29/78* (2006.01)
*H01L 29/06* (2006.01)
(Continued)

(52) U.S. Cl.
CPC .... *H01L 29/0653* (2013.01); *H01L 21/31116* (2013.01); *H01L 21/76224* (2013.01); *H01L 21/76232* (2013.01); *H01L 21/823431* (2013.01); *H01L 29/0847* (2013.01); *H01L 29/161* (2013.01); *H01L 29/1608* (2013.01);
(Continued)

(58) Field of Classification Search
CPC ....... H01L 21/76232; H01L 21/823431; H01L 27/0886; H01L 29/0653; H01L 29/41791; H01L 29/66795; H01L 29/6681; H01L 29/785; H01L 29/7851; H01L 29/7853
See application file for complete search history.

(56) References Cited

U.S. PATENT DOCUMENTS 6,874,443 B2    4/2005  Yeom et al.
8,470,714 B1    6/2013  Tsai et al.
(Continued)

FOREIGN PATENT DOCUMENTS

KR      10-0707983 B1    4/2007
KR    10-2017-054635 A   5/2017

OTHER PUBLICATIONS

Tian, et al. "Characteristics of Large-Diameter Plasma Using a Radial-Line Slot Antenna". J. Vac. Sci. Technol. A 24 (2006) pp. 1421-1424.
(Continued)

*Primary Examiner* — Stephen W Smoot
(74) *Attorney, Agent, or Firm* — Lee & Morse, P.C.

(57) ABSTRACT

Semiconductor devices are provided. The semiconductor device includes a first fin and a second fin on a substrate and a field insulation layer between the first fin and the second fin. The field insulation layer include a first insulation layer and a second insulation layer on the first insulation layer and connected to the first insulation layer. The second insulation layer is wider than the first insulation layer. A ratio of a top width to a bottom width of each of the first fin and the second fin exceeds 0.5.

16 Claims, 18 Drawing Sheets

(51) Int. Cl.

| | |
|---|---|
| *H01L 21/762* | (2006.01) |
| *H01L 21/8234* | (2006.01) |
| *H01L 29/66* | (2006.01) |
| *H01L 29/08* | (2006.01) |
| *H01L 29/16* | (2006.01) |
| *H01L 29/161* | (2006.01) |
| *H01L 21/311* | (2006.01) |
| *H01L 29/165* | (2006.01) |
| *H01J 37/32* | (2006.01) |

(52) U.S. Cl.
CPC .... *H01L 29/6681* (2013.01); *H01L 29/66545* (2013.01); *H01L 29/66795* (2013.01); *H01L 29/7851* (2013.01); *H01L 29/7853* (2013.01); *H01J 37/32192* (2013.01); *H01L 29/165* (2013.01); *H01L 29/7848* (2013.01)

(56) References Cited

U.S. PATENT DOCUMENTS

| | | | |
|---|---|---|---|
| 8,878,309 B1* | 11/2014 | Hong | H01L 27/0886 257/330 |
| 8,916,460 B1 | 12/2014 | Kwon et al. | |
| 8,975,698 B2* | 3/2015 | Mor | H01L 29/785 257/347 |
| 2014/0103452 A1* | 4/2014 | Chang | H01L 21/823431 257/401 |
| 2014/0117454 A1 | 5/2014 | Liu et al. | |
| 2014/0302678 A1 | 10/2014 | Paterson et al. | |
| 2015/0115373 A1* | 4/2015 | Yu | H01L 21/823418 257/401 |
| 2015/0147860 A1 | 5/2015 | Kim et al. | |
| 2015/0162247 A1 | 6/2015 | Choi et al. | |
| 2015/0228495 A1 | 8/2015 | Joubert et al. | |
| 2015/0243659 A1* | 8/2015 | Huang | H01L 27/0886 257/401 |
| 2015/0318398 A1* | 11/2015 | Xie | H01L 29/78 257/288 |
| 2016/0155739 A1* | 6/2016 | Ting | H01L 29/0653 257/401 |
| 2016/0293756 A1* | 10/2016 | Liu | H01L 29/7827 |
| 2017/0133263 A1 | 5/2017 | Min et al. | |

OTHER PUBLICATIONS

Raja, et al. "Computational Modeling Study of the Radial Line Slot Antenna Microwave Plasma Source with Comparisons to Experiments". J. Vac. Sci. Technol. A 31 (2013) pp. 031304-1-031304-11.

* cited by examiner

SEMICONDUCTOR DEVICE HAVING FIELD INSULATION LAYER BETWEEN TWO FINS

CROSS-REFERENCE TO RELATED APPLICATION

Korean Patent Application No. 10-2016-0001535, filed on Jan. 6, 2016, in the Korean Intellectual Property Office, and entitled: "Semiconductor Device," is incorporated by reference herein in its entirety.

BACKGROUND

1. Field

Embodiments relate to a semiconductor device, and more particularly, to a semiconductor device using a three-dimensional channel.

2. Description of the Related Art

One scaling technique for increasing the integration density of a semiconductor device includes using a multi-gate transistor having a fin- or nanowire-shaped silicon body on a substrate and a gate on the surface of the silicon body.

Such a multi-gate transistor uses a three-dimensional channel, thus allowing for ease of scaling thereof. Furthermore, the multi-gate transistor may have improved current control capability without increasing the length of the gate thereof. In addition, a short channel effect (SCE) in which electric potential in a channel region is influenced by a drain voltage can be effectively suppressed.

SUMMARY

One or more embodiments provide a semiconductor device, including a first fin and a second fin protruding from a substrate and including respective longer sides and shorter sides, the shorter side of the first fin and the shorter side of the second fin being spaced apart from each other to face each other, a field insulation layer between the shorter side of the first fin and the shorter side of the second fin, the field insulation layer including a first insulation layer and a second insulation layer on the first insulation layer, a gate on the first fin to intersect the first fin, a dummy gate on the field insulation layer, and a source/drain in the first fin between the gate and the dummy gate, wherein the second insulation layer is wider than the first insulation layer and a portion of the source/drain is below the second insulation layer.

One or more embodiments provide a semiconductor device, the semiconductor device comprises a first fin and a second fin formed on a substrate and a field insulation layer formed between the first fin and the second fin, and including a first insulation layer and a second insulation layer formed on the first insulation layer and connected to the first insulation layer, the second insulation layer having a width wider than a width of the first insulation layer, wherein a ratio of a top width to a bottom width of each of the first fin and the second fin exceeds 0.5.

One or more embodiments provide a semiconductor device, the semiconductor device including a first fin and a second fin protruding on a substrate and including respective longer sides and shorter sides, the shorter side of the first fin and the shorter side of the second fin being spaced apart from each other to face each other, a field insulation layer extending between the shorter side of the first fin and the shorter side of the second fin, a gate extending on the first fin to intersect the first fin, a dummy gate formed on the field insulation layer and a source/drain formed in the first fin between the gate and the dummy gate, wherein each of the first fin and the second fin has a ratio of a top width to a bottom width measured along the shorter side of each of the first fin and the second fin exceeds 0.5.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Figure 1:
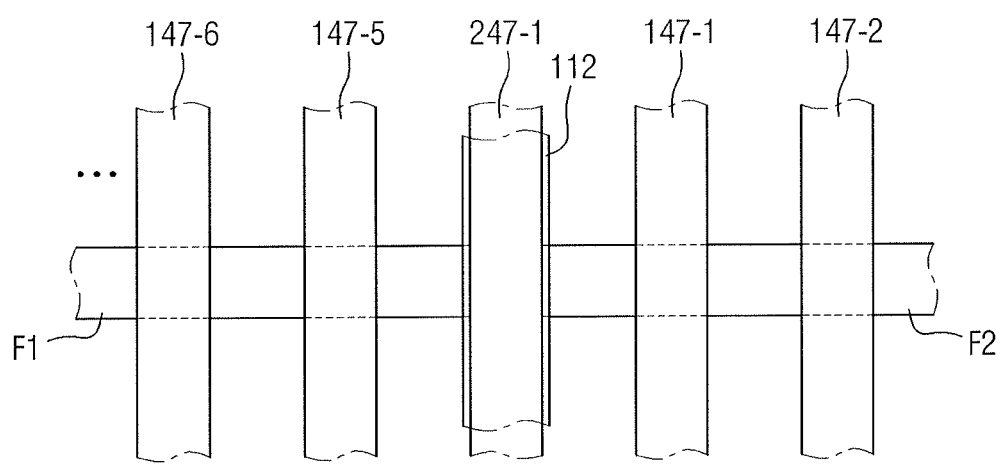
FIG. 1 illustrates a plan view of semiconductor devices according to some embodiments.
Figure 2:
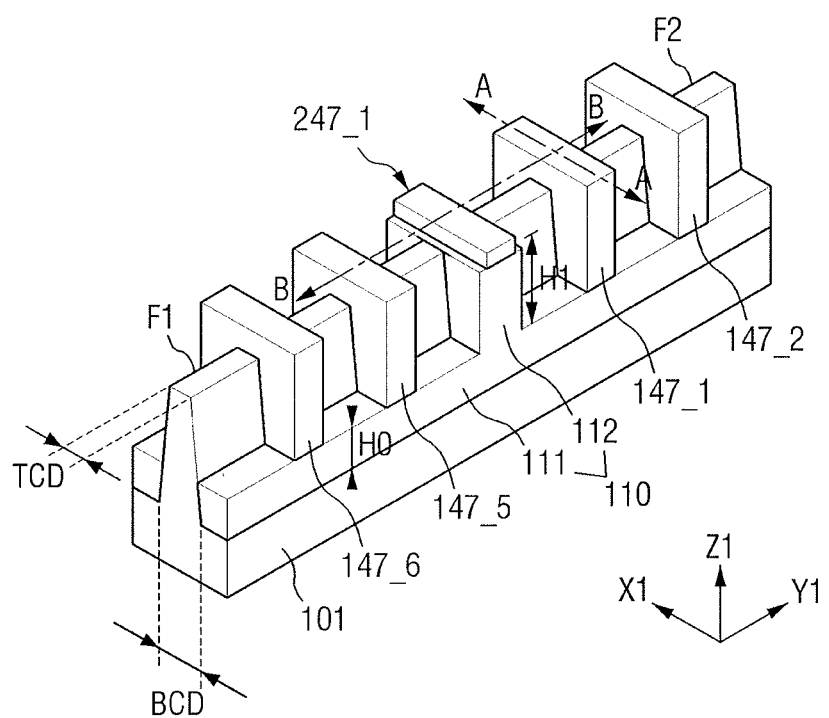
FIG. 2 illustrates a perspective view of semiconductor devices according to some embodiments.
Figure 3:
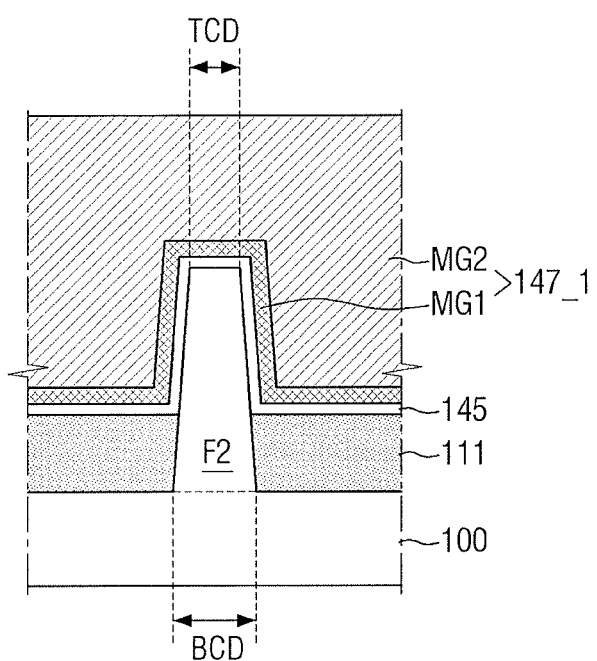
FIG. 3 illustrates a cross-sectional view taken along line A-A of FIG. 2.
Figure 4:
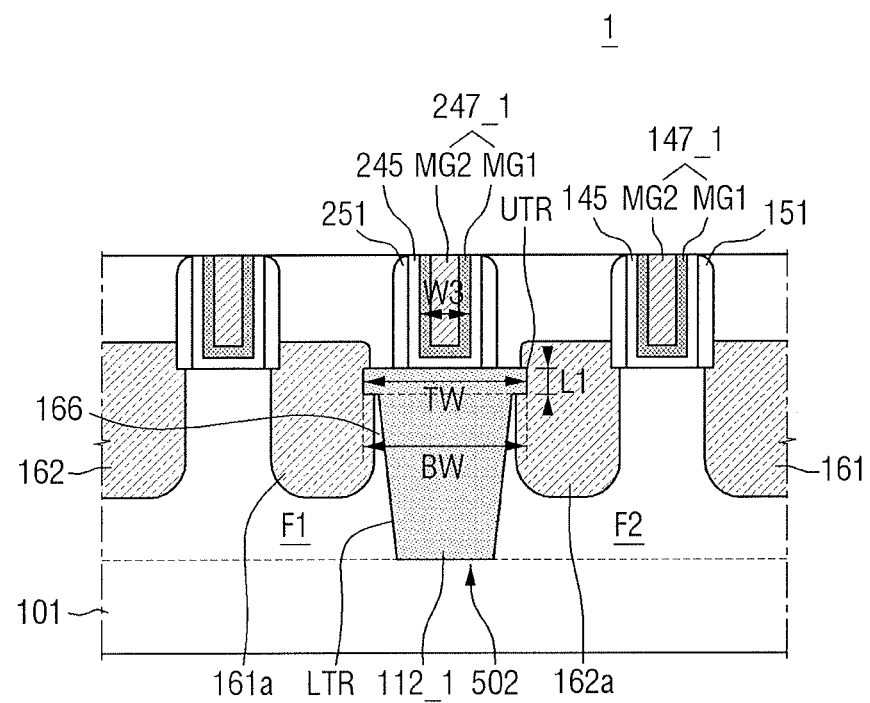
FIG. 4 illustrates a cross-sectional view taken along line B-B of FIG. 2.

Semiconductor devices according to some embodiments will be explained with reference to FIG. 1 to FIG. 4. FIG. 1 is a plan view illustrating semiconductor devices according to some embodiments. FIG. 2 is a perspective view illustrating semiconductor devices according to some embodiments. FIG. 3 is a cross-sectional view taken along line A-A of FIG. 2. FIG. 4 is a cross-sectional view taken along line B-B of FIG. 2.

Referring to FIG. 1 to FIG. 4, the semiconductor device according to some embodiments may include a plurality of fins F1 and F2, a plurality of gates 147_1, 147_2, 147_5 and 147_6, a field insulation layer 110, a plurality of dummy gates 247_1, a plurality of sources/drains 161 and 162 and the like.

The plurality of fins F1 and F2 may extend along a second direction Y1. The fins F1 and F2 may be a part of a substrate 101, or may include an epitaxial layer grown from the substrate 101. Although the drawings herein depict two fins F1 and F2 that extend along a same center in a lengthwise direction, i.e., a second direction Y1, the present disclosure is not limited thereto.

Although the drawings herein depict the fins F1 and F2 formed in an overall rectangular parallelepiped shape, the present disclosure is not limited thereto. That is, the fins F1 and F2 may have a chamfered shape or have rounded edges. Since the fins F1 and F2 extend in the second direction Y1, the fins F1 and F2 may have longer sides in the second direction Y1 and shorter sides in a first direction X1. As shown in the drawings, the shorter sides of the fins F1 and F2 may face each other. Even when the fins F1 and F2 have chamfered or rounded edges, it would be obvious to a person skilled in the art to distinguish between longer sides and shorter sides.

The fins F1 and F2 may serve as an active pattern used in a multi-gate transistor. That is, channels may be interconnected along three sides of the fins F1 and F2, or formed at two sides of the fins F1 and F2 facing each other.

As shown in FIG. 2, the field insulation layer 110 may be formed on the substrate 101 and surround a part of the plurality of fins F1 and F2. The field insulation layer 110 may be formed of a high density plasma (HDP) oxide layer, tetraethylorthosilicate (TEOS), plasma enhanced tetraethylorthosilicate (PE-TEOS), O3-tetra ethyl ortho silicate (O3-TEOS), undoped silicate glass (USG), phosphosilicate glass (PSG), borosilicate glass (BSG), borophosphosilicate glass (BPSG), fluoride silicate glass (FSG), spin on glass (SOG), or a combination thereof.

The field insulation layer 110 may include a first portion 111 and a second portion 112 having different heights. The first portion 111 may extend in the second direction Y1, and the second portion 112 may extend in the first direction X1. The field insulation layer 110 may be an oxide layer, a nitride layer, an oxynitride layer, or a combination thereof. The first portion 111 may contact, e.g., directly contact, the longer sides of the fins F1 and F2, and the second portion 112 may to contact the shorter sides of the fins F1 and F2, e.g. directly contact sidewalls of the fins F1 and F2. The first portion 111 may have a height H0, and the second portion 112 may have a height H0+H1, as shown in FIG. 2. The second portion 112 may perform a function of an insulator for electrically isolating the fins F1 and F2.

In particular, as shown in FIG. 4, a trench 502 may be formed between the fins F1 and F2. That is, the trench 502 may be interposed between the shorter sides of the fins F1 and F2 facing each other. The second portion 112 may be interposed between the fins F1 and F2, e.g., may be disposed in the trench 502 to completely fill the trench 502.

The trench 502 may include an upper region UTR and a lower region LTR having different widths. The width of the upper region UTR may be wider than that of the lower region LTR, e.g., a smallest width in the upper region UTR may be wider than a largest width of the lower region LTR. In the present embodiment, the feature of the upper region and the lower region of the trench 502 having different widths may mean that the profile of the upper region and the profile of the lower region may not be continuously connected to each other, as shown in the drawings. In other words, a width of a bottom surface of the upper region UTR may be greater than a width of an upper surface of the lower region LTR that is adjacent to the bottom surface of the upper region UTR. That is, the upper region UTR and the lower region LTR of the trench 502 may be form a multi-step structure.

Furthermore, the sidewall of the lower region LTR of the trench 502 may have a slope, and the width of the lower region LTR may be continuously decrease approaching the substrate 101. However, the trench 502 may have perpendicular sidewalls such that the lower region LTR may have the same width throughout.

As described above, the second portion 112 may extend in the first direction X1. In this case, as shown in FIG. 1, the second portion 112 may include, in the first direction X1, a region that overlaps the fins F1 and F2 and a region that does not overlap the fins F1 and F2. In other words, the second portion may extend beyond the fins F1 and F2 in the first direction X1. A first insulation layer 112_1 and a second insulation layer 112_2 may be disposed in the region that overlaps the fins F1 and F2.

That is, the trench 502 between the fins F1 and F2 may include the lower region LTR and the upper region UTR having different widths as described above, such that the first insulation layer 112_1 in the lower region LTR may also have a width different from that of the second insulation layer 112_2 in the upper region UTR. Specifically, the width of the second insulation layer 112_2 may be wider than that of the first insulation layer 112_1. In the present embodiment, the feature of the first insulation layer 112_1 and the second insulation layer 112_2 having different widths may mean that the profile of the first insulation layer 112_1 and the profile of the second insulation layer 112_2 may not be continuously connected to each other, as shown in the drawings. That is, the first insulation layer 112_1 and the second insulation layer 112_2 may have a multi-step structure.

The second insulation layer 1122 may have a top surface with a first width TW and a bottom surface with a second width BW. The first width TW and the second width BW may be different from each other. That is, the first width TW may be wider or narrower than the second width BW. In this case, the ratio of the first width TW to the second width BW may be 0.9 or higher. Furthermore, the ratio of the first width TW to the second width BW may be 1 or higher than 1. That is, when the ratio of the first width TW to the second width BW is 1, the second insulation layer 1122 may have a rectangular cross-sectional surface, and when the ratio of the first width TW to the second width BW is higher than 1, the second insulation layer 112_2 may have an inverse trapezoidal cross-sectional surface. The ratio of the first width TW to the second width BW is 1 can be controlled through a method for manufacturing the semiconductor device according to embodiments. This will be described in detail below.

The second portion 112 may be formed beneath the dummy gate 247_1, and the first portion 111 may be formed beneath the gates 147_1, 147_2, 147_5 and 147_6. In the particular example shown, gates 147_1 and 147_2 may be formed on the second fin F2 and gates 147_5 and 147_6 may be formed on the first fin such that the gates 147_1, 147_2, 147_5 and 147_6 intersect the corresponding fins F2 and F1. The gates 147_1, 147_2, 147_5 and 147_6 may extend in the first direction X1.

The dummy gate 247_1 may be formed on the second portion 112. Specifically, only one dummy gate 247_1 may be formed on the corresponding second portion 112. Since only one dummy gate 247_1 rather than two or more dummy gates 247_1 is formed, a layout size can be reduced. Furthermore, the width W2 of the dummy gate 247_1 may be narrower than the width W1 of the second portion 112. Thus, the dummy gate 247_1 may be stably disposed on the second portion 112. Thus, since the width of the dummy gate is the same as that of other gates, at least the second insulation layer 1122 may be wider in the first direction X1 than the fins F1 and F2, Referring back to FIG. 3 and FIG. 4, each gate (for example, gate 147_1) may include metal layers MG1 and MG2. As shown in the drawings, the gate 147_1 may be formed by stacking two or more metal layers MG1 and MG2. The first metal layer MG1 may serve to regulate a work function, and the second metal layer MG2 may serve to fill a space in the first metal layer MG1. For example, the first metal layer MG1 may include at least one of titanium nitride (TiN), tantalum nitride (TaN), titanium carbide (TiC), and tantalum carbide (TaC). The second metal layer MG2 may include tungsten (W) or aluminum (Al). The gate 147_1 may be formed through, e.g., a replacement process (or a gate last process), but the present disclosure is not limited thereto.

Each dummy gate (for example, dummy gate 247_1) may have a structure similar to the structure of the gate 147_1. As shown in the drawings, the dummy gate 247_1 may be formed by stacking two or more metal layers MG1 and MG2. For example, the first metal layer MG1 may serve to regulate a work function, and the second metal layer MG2 may serve to fill the space formed by the first metal layer MG1.

A gate insulation layer 145 may be interposed between the first fin F1 and the gate 147_1. As shown in FIG. 3, the gate insulation layer 145 may be formed on a top surface and sidewalls of the first fin F1 extending above the first portion 111. Furthermore, the gate insulation layer 145 may be interposed between the gate 147_1 and the first portion 111. The gate insulation layer 145 may include a high dielectric constant material having a dielectric constant higher than that of a silicon oxide layer. For example, the gate insulation layer 145 may include hafnium dioxide (HfO$_2$), zirconium dioxide (ZrO$_2$), or tantalum pentoxide (Ta$_2$O$_5$).

The plurality of sources/drains 161 and 162 may be disposed among the plurality of gates 147_1, 1472, 147_5 and 147_6, and between the gate (for example, gate 147_1) and the dummy gate (for example, dummy gate 247_1). The sources/drains 161 and 162 may be elevated sources/drains protruding further than the fins F1 and F2.

Furthermore, a part of the sources/drains 161 and 162 may overlap a spacer 151. A part of the sources/drains 161 and 162 may overlap the second insulation layer 112_2. That is, a part of the sources/drains 161 and 162 may have a tuck shape tucked under the spacer 151 and the second insulation layer 112_2, e.g., an interface between the isolation region and the active region is not linear, but includes an indentation.

The height of the source/drain 161 and 162 disposed among the plurality of gates 147_1, 147_2, 147_5 and 147_6 and the height of the source/drain 162a and 161a interposed between the gates 147_1 and 147_5 and the dummy gate 247_1 may be the same. That is, the source/drain 161a and 162a interposed between the gates 147_1 and 147_5 and the dummy gate 247_1 may be full sized.

When a semiconductor device 1 according to a first embodiment is a PMOS transistor, the sources/drains 161 and 162 may include a compressive stress material. For example, the compressive stress material may have a lattice constant larger than that of Si, and may be, for example, silicon germanium (SiGe). The compressive stress material may apply compressive stress to the first fin F1 so as to improve carrier mobility in a channel region.

When the semiconductor device 1 according to the first embodiment is an NMOS transistor, the sources/drains 161 and 162 may include a material same as that of the substrate 101, or a tensile stress material. For example, when the substrate 101 is Si, the sources/drains 161 and 162 may be Si or a material having a lattice constant smaller than that of Si (for example, SiC).

Alternatively, the sources/drains 161 and 162 may be formed by doping the fins F1 and F2 with impurities.

The spacers 151 and 251 may include at least either a nitride layer or an oxynitride layer. The spacers 151 and 251 may be formed on sidewalls of the plurality of fins F1 and F2, sidewalls of the plurality of gates 1471, 147_2, 147_5 and 147_6, and sidewalls of the plurality of dummy gates 247_1.

The substrate 101 may be made of one or more semiconductor materials selected from a group consisting of Si, Ge, SiGe, GaP, GaAs, SiC, SiGeC, InAs and InP. The substrate 101 may be a silicon-on-insulator substrate.

The top surface of the second portion 112, i.e., the top surface of the second insulation layer 112_2, may be formed on the same plane with the top surface of the fins F1 and F2 i.e., may have a same height along a third direction Z1, but the present disclosure is not limited thereto. Thus, the top surface of the second portion 112 may be disposed closer to the substrate 101 as compared with the top surface of the fins F1 and F2, i.e., may be shorter than the fins F1 and F2.

The width BW of the top surface of the second insulation layer 112_2 may be wider than the width of the first insulation layer 112_1. The width BW of the top surface of the second insulation layer 112_2 may be wider than a width W3 of the dummy gate 247_1. Thus, the dummy gate 247_1 can be stably disposed on the second insulation layer 112_2. Furthermore, a thickness L1 of the second insulation layer 112_2 may range from 0.01 Å to 300 Å. A thickness L1 may change depending on processes.

Referring back to FIG. 4, since the second insulation layer 112_2 is wider than the first insulation layer 112_1 as shown, the first insulation layer 112_1 and the elevated source/drain 162 do not contact each other, and a part 166 of the fins F1 and F2 may be interposed between the first insulation layer 112_1 and the elevated source/drain 162, but the present disclosure is not limited thereto.

Referring back to FIG. 2 and FIG. 3, the fins F1 and F2 according to the embodiments may have a top width TCD and a bottom width BCD. The top width TCD may be a length of the top surface of the fins F1 and F2 in the first direction X1. However, the top surface of the fins F1 and F2 is depicted as flat in the present embodiment, but the present disclosure is not limited thereto. Thus, when the top surface of the fins F1 and F2 are protruded, that is, shaped as a hemisphere, the top width TCD may mean the width of the fins F1 and F2 at the point of 5 nm below from the highest point of the protruded hemisphere shape. The bottom width BCD may be a length measured along the first direction X1 from the point where the fins F1 and F2 and the substrate 101 are connected.

Referring to FIG. 3, the ratio of the top width TCD to the bottom width BCD of the fins F1 and F2 may be 0.5 or higher. That is, the ratio of the top width TCD to the bottom width BCD can be controlled through a method for manufacturing the semiconductor device according to embodiments. Therefore, the ratio of the top width TCD to the bottom width BCD can be made as large as possible, up to 1. When the ratio is almost 1, sidewalls of the fins F1 and F2 have a slope close to perpendicular. The method for manufacturing the semiconductor device according to embodiments will be described later.

The semiconductor device according to embodiments may include fins of which ratio of the top width TCD to the bottom width BCD is 0.5 or higher, e.g., up to 1. Thus, the semiconductor device may have improved performance, and the plurality of fins of the semiconductor device may have a uniform width. Furthermore, the semiconductor device according to embodiments may include the second insulation layer 112_2 having a controllable shape.

A method for manufacturing a semiconductor device according to some embodiments will now be described with reference to FIG. 5 to FIG. 18. FIG. 5 to FIG. 18 illustrate stages in a method for manufacturing the semiconductor device according to some embodiments.

Figure 12:
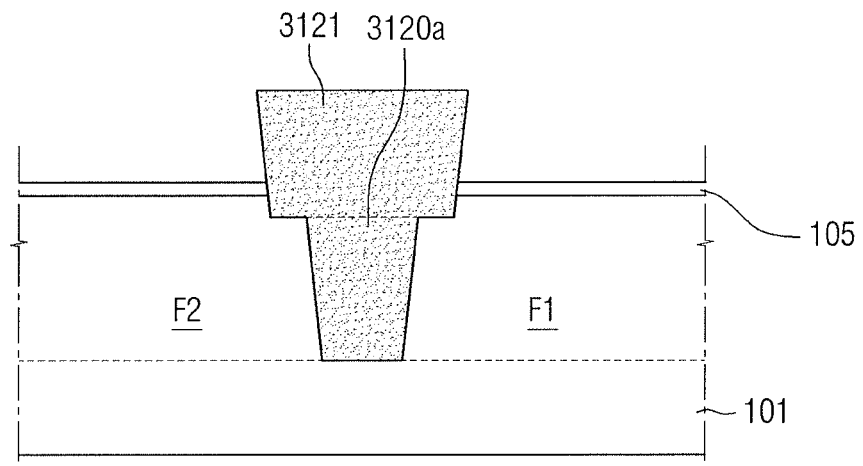
Figure 13:
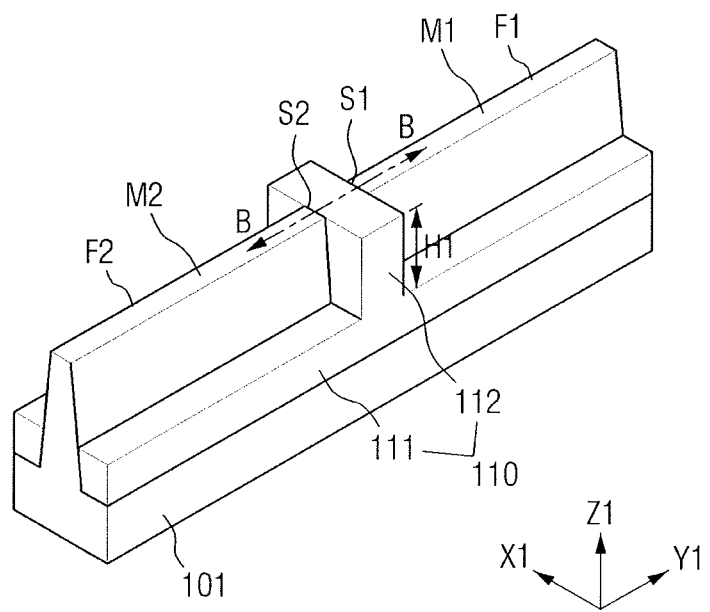
Figure 14:
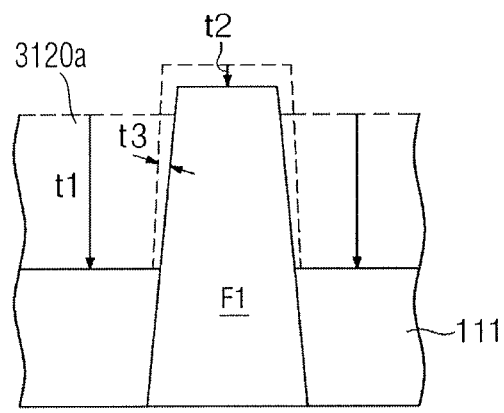
Figure 15:
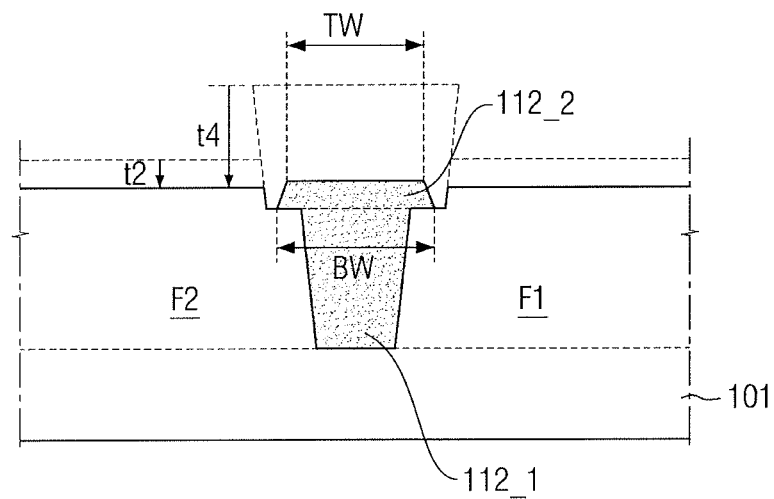
Figure 16:
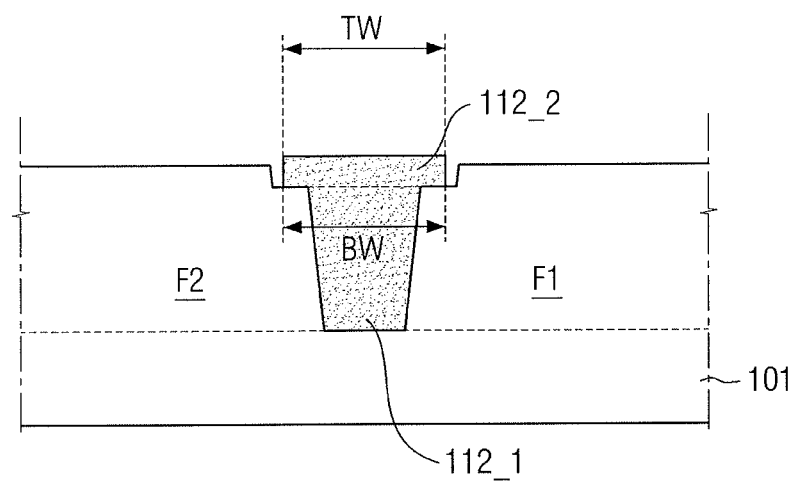
Figure 17:
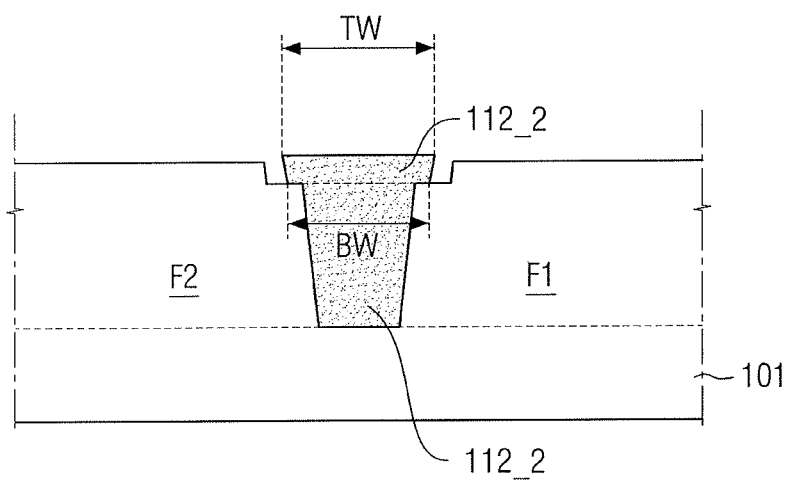
Figure 18:
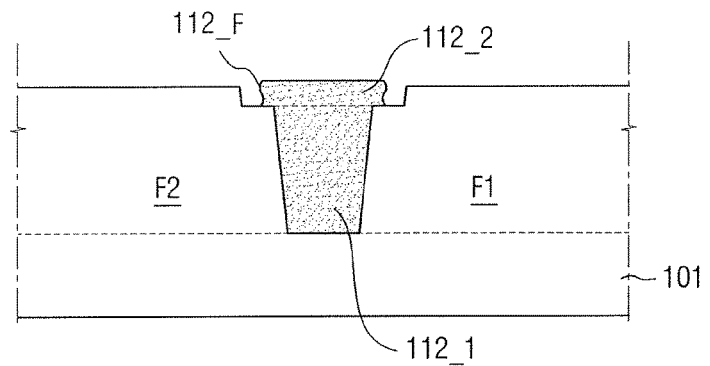

FIG. 5, FIG. 7, FIG. 9, FIG. 11 and FIG. 13 are perspective views. FIG. 6 is a cross-sectional view taken along line B-B of FIG. 5. FIG. 8 is a cross-sectional view taken along line B-B of FIG. 7. FIG. 10 is a cross-sectional view taken along line B-B of FIG. 9. FIG. 12 is a cross-sectional view taken along line B-B of FIG. 11. FIG. 14 is a cross-sectional view taken along line A-A of FIG. 13, and FIG. 15 is a cross-sectional view taken along line B-B of FIG. 13. FIG. 16 to FIG. 18 are diagrams illustrating exemplary embodiments different from the embodiment illustrated in FIG. 15.

Figure 5:
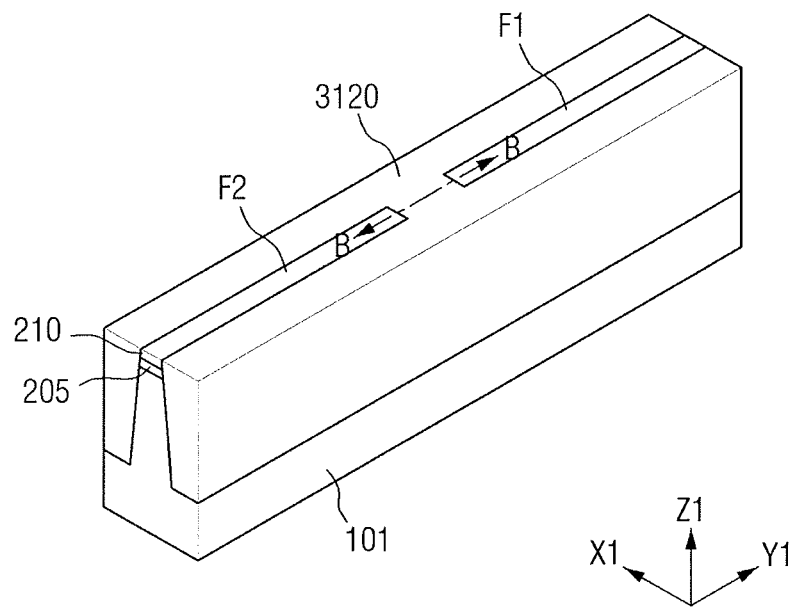
FIG. 5 to FIG. 18 illustrate stages in a method for manufacturing the semiconductor device according to some embodiments.
Figure 6:
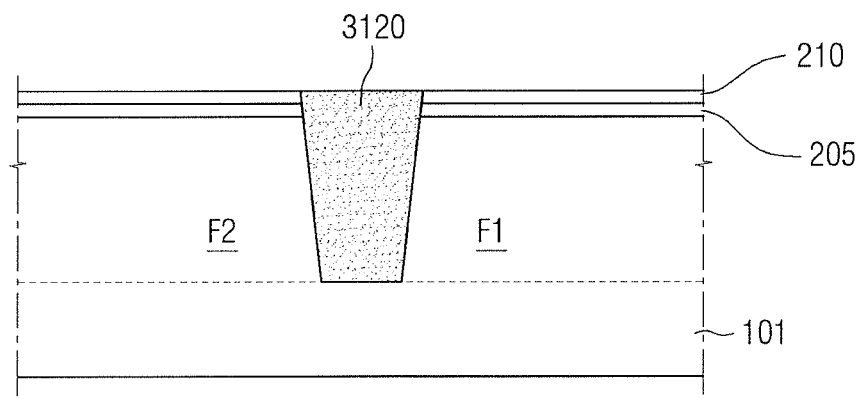

Referring to FIG. 5 and FIG. 6, the first fin F1 and the second fin F2 may be formed on the substrate 101 such that the fins F1 and F2 are adjacent to each other in a lengthwise direction. Subsequently, an insulation layer 3120 may be formed between the first fin F1 and the second fin F2. In this case, the insulation layer 3120 may be an oxide layer, a nitride layer, an oxynitride layer or a combination thereof.

The height of the first fin F1 and the second fin F2, that is, the length protruding in the third direction Z1 may range from approximately 10 nm to 50 nm. The distance along the second direction Y1 between the shorter sides of the first fin F1 and the second fin F2 facing each other can be determined depending on the type and shape of the device to be formed by using the first fin F1 and the second fin F2.

Forming the first fin F1 and the second fin F2 may include forming a fin mask pattern 210 on a substrate on which the first fin F1 and the second fin F2 will be formed, and then anisotropically etching the substrate by using the fin mask pattern 210 as an etching mask. The fin mask pattern 210 may include a plurality of layers which have etch selectivity relative to each other and are sequentially stacked. A buffer layer 205 may be provided on the substrate prior to the formation of the fin mask pattern 210. The buffer layer 205 may include a silicon oxide layer or a silicon oxynitride layer. The fin mask pattern 210 may be removed after formation of the first fin F1 and the second fin F2. Therefore, although the fin mask pattern 210 is depicted as remaining on the first fin F1 and the second fin F2 in FIG. 7, the present disclosure is not limited thereto.

Figure 7:
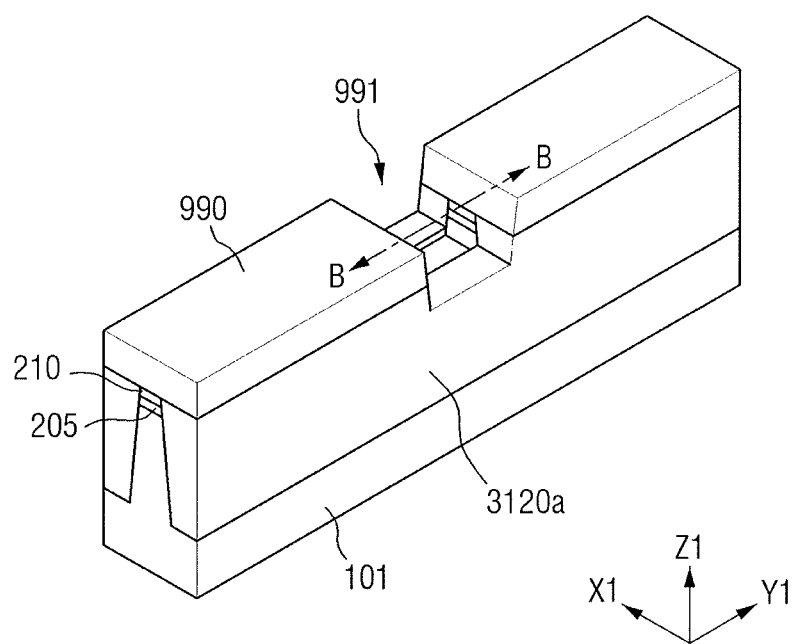
Figure 8:
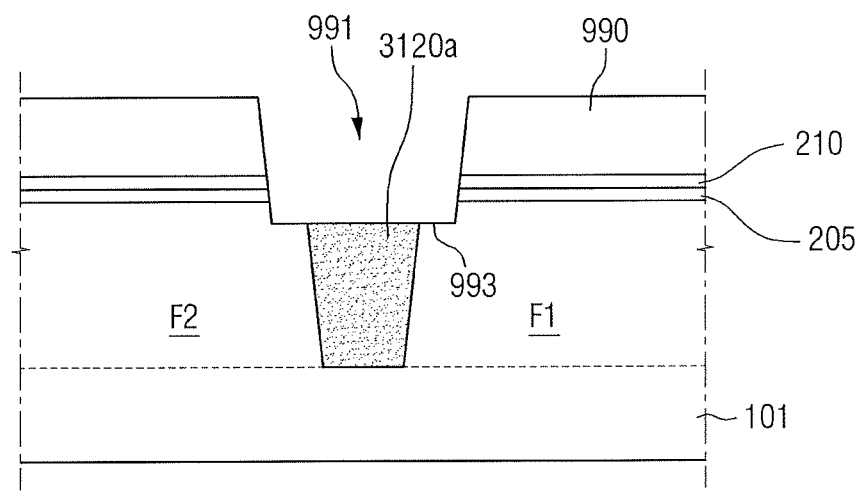

Referring to FIG. 7 and FIG. 8, a mask pattern 990 including an opening 991 may be formed on the first fin F1, the second fin F2 and the insulation layer 3120.

In this case, the mask pattern 990 may have a height determined in consideration of a subsequent planarizing process, a field recess process and the like. The mask pattern 990 may be a material having an etch ratio with respect to the insulation layer 3120, e.g., the mask pattern 990 may be a nitride layer when the insulation layer 3120 is an oxide layer. The opening 991 may have a linear shape.

Subsequently, a part of the first fin F1, a part of the second fin F2, and a part of the insulation layer 3120 may be removed by using the mask pattern 990 so as to form a trench 993 having an opening 991 and the insulation layer 3120a. For example, the trench 993 may be formed through a drying etching process.

Figure 9:
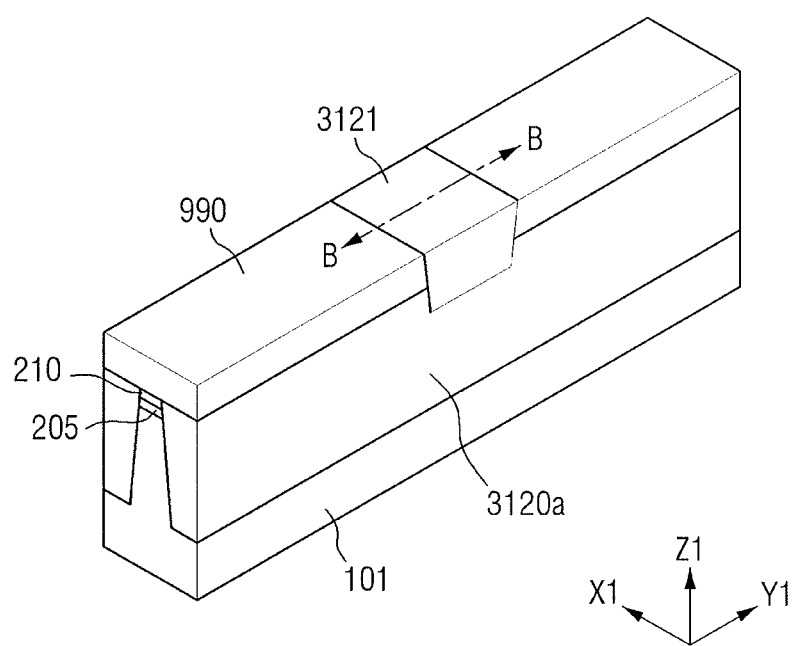
Figure 10:
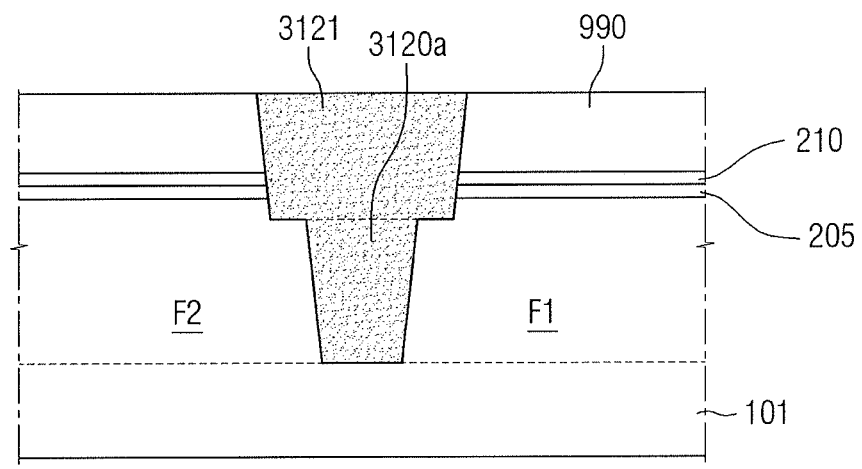

Referring to FIG. 9 and FIG. 10, an insulation layer 3121 may be formed to fill the trench 993 and the opening 991.

Specifically, the insulation layer 3121 may be formed on the mask pattern 990 so as to fully fill the trench 993 and the opening 991. Subsequently, the top surface of the insulation layer 3121 and the top surface of the mask pattern 990 may be planarized. The insulation layer 3121 may be made of a material same as that of the insulation layer 3120, but the present disclosure is not limited thereto. Therefore, the insulation layer 3121 and the insulation layer 3120 may be made of materials having different etch ratios.

Figure 11:
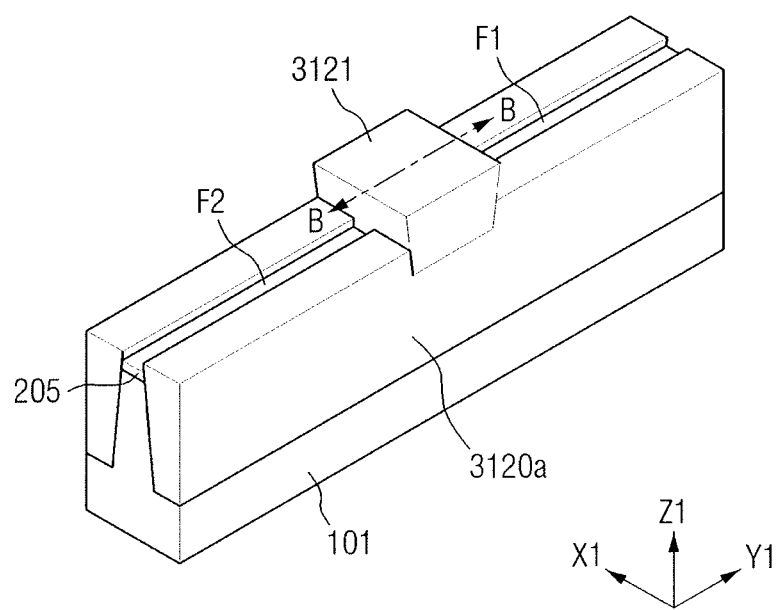

Referring to FIG. 11 and FIG. 12, the mask pattern 990 may be removed. For example, the mask pattern 990 may be removed through a wet etching process. The fin mask pattern 210 may also be removed during the removal of the mask pattern 990. An insulation layer 3120a may be formed to have a top surface thereof higher than a top surface of the buffer layer 205, but the present disclosure is not limited thereto. Forming the insulation layer 3120a may include a planarizing process.

Referring to FIG. 13 to FIG. 15, a field recess process may be performed. That is, at least a part of the insulation layers 3120a and 3121, a part of the first fin F1 and a part of the second fin F2 can be simultaneously removed. Resultantly, the height of the insulation layer 3120a contacting longer sides of the fins F1 and F2 may be lowered so as to form the first portion 111 of the field insulation layer 990. Furthermore, the height of the insulation layer 3121 may be lowered to form the second portion 112 of the field insulation layer 990.

Removing a part of the insulation layers 3120a and 3121 may include a dry etching process. The dry etching process may have etch selectivity with respect to the insulation layers 3120a and 3121.

FIG. 14 and FIG. 15 conceptually illustrate the removal of a part of the fins F1 and F2 performed and the formation of the first insulation layer 112_1 and the second insulation layer 112_2 during the removal of the insulation layers 3120a and 3121. These can be performed through the same process of etching the insulation layers.

The exposed top portion of the fins F1 and F2 can also be affected by the removal of the top portions of the insulation layers 3120a and 3121. Thus, the width of the top portion of the initially formed fins F1 and F2 may be reduced. As shown in FIG. 16, the fins F1 and F2 may be gradually exposed to an etch source from the top portion thereof while the insulation layer 3120a is removed as much as the first thickness t1 so as to be formed into the first portion 111 of the field insulation layer 110. Thus, the top portion of the fins F1 and F2 can be removed as much as a second thickness t2, and sidewalls of the fins F1 and F2 can be removed as much as a third thickness t3.

As shown in FIG. 15, the insulation layer 3121 may be removed as much as a fourth thickness t4 so as to be formed into the first insulation layer 112_1 and the second insulation layer 112_2 included in the first portion 112 of the field insulation layer 110. The first thickness t1 and the fourth thickness t4 may be the same, but the present disclosure is not limited thereto. As described above, the insulation layer 3121 may be made of a material having etch selectivity different from that of the insulation layer 3120a. Thus, the width of the first insulation layer 112_1 and the width of the second insulation layer 112_2 may be different from each other.

Furthermore, the second insulation layer 112_2 may have the first width TW and the second width BW, and the ratio of the first width TW to the second width BW may be 0.5 or higher. In the present embodiment, the ratio of the first width TW to the second width BW may vary depending on the condition and number of repetition of the etching process of the insulation layers 3120a and 3121.

Thus, FIG. 16 to FIG. 18 illustrate the second insulation layer 1122 having various shapes. Referring to FIG. 16, the ratio of the first width TW to the second width BW may be 1, and in this case, the second insulation layer 1122 may have a rectangular cross-sectional area. Referring to FIG. 17, the ratio of the first width TW to the second width BW may exceed 1, and in this case, the second insulation layer 112_2 may have an inverse trapezoidal cross-sectional area.

Referring to FIG. 18, the second insulation layer 112_2 may have a curved sidewall 112_F. The curved sidewall 112_F shown in FIG. 18 may be applied to other embodiments.

Meanwhile, the ratio of the second thickness t2 and/or the third thickness t3 to the first thickness t1 may be determined depending on the etch selectivity of an etch source. As the second thickness t2 and the third thickness t3 increase, i.e., as the fins F1 and F2 are removed as much as possible together with the top portions of the insulation layers 3120a and 3121, the top width of the final fins F1 and F2 may be much reduced after the removal as compared with the initial fins F1 and F2. A channel region of a transistor may be formed in the top portion of the final fins F1 and F2, and when the width of the top portion of the final fins F1 and F2 is reduced, the channel width may also be reduced, thereby causing degradation of a device such as a reduction in charge carrier mobility or an undesired high threshold voltage of the transistor.

A process of etching the insulation layers 3120a and 3121 will now be described in more detail with reference to FIG. 19 to FIG. 24.

Figure 19:
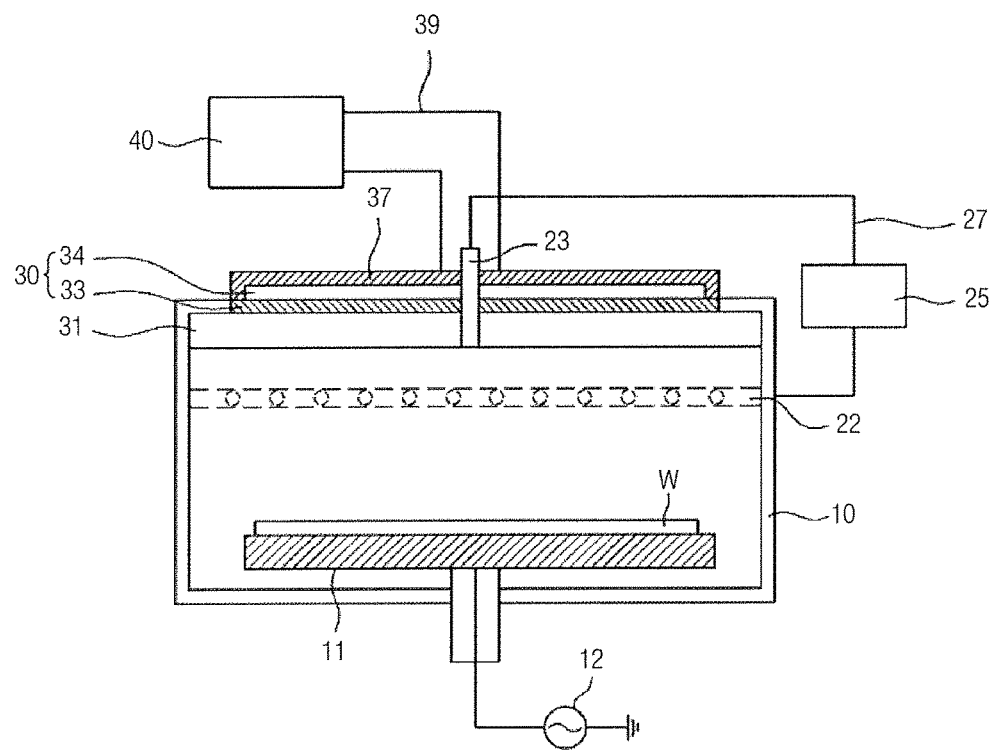
FIG. 19 illustrates a conceptual view of etching equipment for performing the insulation layer etching process according to embodiments.

Etching equipment for performing the insulation layer etching process according to embodiments will be described with reference to FIG. 19. FIG. 19 is a conceptual view of etching equipment for performing the insulation layer etching process according to embodiments. The insulation layer etching process according to embodiments may be performed in an etching device including a process chamber 10. The etching device may be etching equipment using a high density plasma source. More specifically, the etching device according to embodiments may be surface wave plasma (SWP) equipment including a radial line slot antenna 31.

The etching device may include a susceptor 11 beneath which a wafer W may be arranged. The susceptor 11 may be connected to radio frequency (RF) bias 12. The RF bias as used hereinafter may mean the RF bias 12 connected to the susceptor 11. As an exemplary embodiment, high frequency of 13.56 MHz can be applied to the susceptor 11 by the RF bias 12. The wafer W can be electrostatically adsorbed to the susceptor 11 by direct current power. The susceptor 11 may be connected to a heater.

The chamber 10 may be connected to a gas supply source 25 so as to receive treatment gas. As an exemplary embodiment, the treatment gas may include gas for plasma excitation and etching gas. The gas for plasma excitation may include at least one of argon (Ar), helium (He), neon (Ne), krypton (Kr), and xenon (Xe). The etching gas may include a carbon fluorine (CF)-based etching source. As an exemplary embodiment, the CF-based etching source may include C4F6 or C4F8. The etching gas may include oxidizing gas. The oxidizing gas may include oxygen ($O_2$), carbon dioxide ($CO_2$), or carbon monoxide (CO).

The gas supply source 25 may include a first gas supply unit 23 disposed in an upper portion of the chamber 10, and a second gas supply unit 22 shaped as a ring extending along an inner sidewall of the chamber 10. The gas supply unit 22 may include a plurality of openings or nozzles to supply treatment gas from the sidewall to the center of the chamber 10.

The etching device may include a radial line slot antenna (RLSA) 30 disposed on the chamber 10 so as to generate microwave plasma. The RLSA 30 may be connected to a microwave generator 40 through a waveguide 39. That is, microwave generated from the microwave generator 40 may be supplied to the RLSA 30 through the waveguide 39. As an exemplary embodiment, the microwave generator 40 may generate microwave of 2.45 GHz. As an exemplary embodiment, high frequency power for generating the microwave may be regulated in a range from 100 W to 3000 W. The RLSA 30 may include a slot plate 33 made of a conductive material such as copper or aluminum, and a dielectric plate 34 disposed on the slot plate 33. The slot plate 33 may have T-shaped slits formed at a lower surface thereof. As an exemplary embodiment, the slits may be arranged in a shape of a concentric circle. The microwave which has reached the RLSA 30 may be diffused in a radial direction of the RLSA 30, and radiated into the chamber 10 through the slits of the slot plate 33. Thus, the treatment gas beneath the RLSA 30 may be ionized to generate plasma in the chamber 10.

The dielectric plate 34 may enable the microwave propagating toward the RLSA 30 along the waveguide 39 to propagate in a radial direction of the dielectric plate 34, and may compress the wavelength of the microwave. As an exemplary embodiment, the dielectric plate 34 may include quartz, ceramic, or alumina. The dielectric plate 34 may have an upper surface and a lower surface covered with a conductor. A cooling plate 37 may be provided on the dielectric plate 34. The cooling plate 37 may discharge heat generated from the RLSA 30 to outside. As an exemplary embodiment, the cooling plate 37 may include a thermally conductive material such as copper or aluminum.

A dielectric window 31 may be provided beneath the RLSA 30. The dielectric window 31 may seal the inside of the chamber 10. The dielectric window 31 may have microwave transmittance. As an exemplary embodiment, the dielectric window 31 may include quartz, ceramic, or alumina.

The etching device may use microwave as a plasma source, and generate high density plasma having a low electron temperature in a region where etching is performed. Thus, damages caused in the wafer W by ion bombardment during an etching process may be reduced. Furthermore, since the treatment gas is supplied through the ring-shaped second gas supply unit 22 beneath the dielectric window 31, dissociation of the treatment gas can be controlled.

Figure 20:
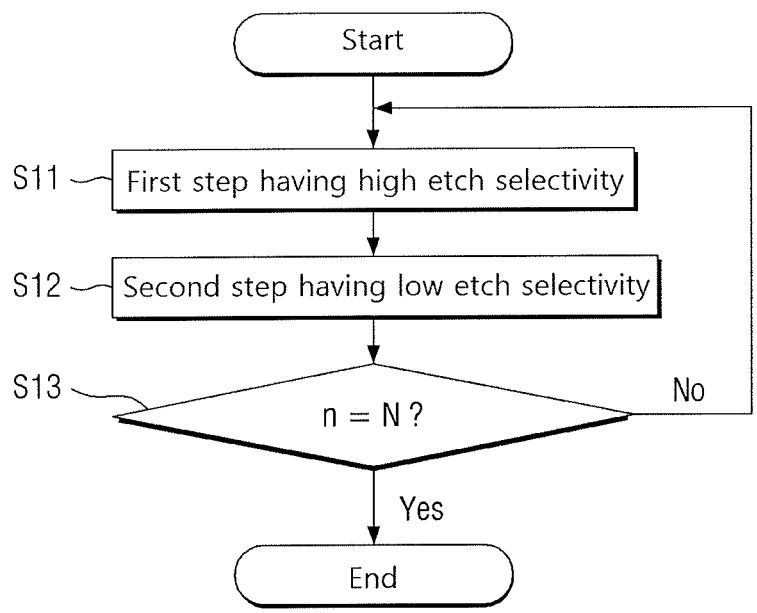
FIG. 20 illustrates a flowchart of an insulation layer etching process according to embodiments.

FIG. 20 is a flowchart illustrating an insulation layer etching process according to embodiments. The insulation layer etching process according to embodiments may be performed in the etching device shown in FIG. 19.

Referring to FIG. 20, the insulation layer etching process according to embodiments may include a first step (S11) in which etch selectivity of the insulation layers 3120a and 3121 relative to the fins F1 and F2 is higher, and a second step (S12) in which the etch selectively is relatively lower than that of the first step (S11). The first step (S11) and the second step (S12) can be performed in the same process chamber. The first step (S11) and the second step (S12) can be repeated at least twice in a cyclic manner. When the number of repetition of the first step (S11) and the second step (S12) has reached a preset value N (S13), the etching process may end.

The first step (S11) may be a more polymeric condition than the second step (S12). The second step (S12) may be a less polymeric condition than the first step (S11). The term "more polymeric condition" is used herein to describe a condition in which a polymer formed on a surface of an object to be bonded through a combination between the object to be etched and an etch source in an etching step (hereinafter, referred to as "surface polymer") is relatively thick, and the term "less polymeric condition" may be used herein to describe a condition in which the surface polymer is relatively thin. As an exemplary embodiment, when CF-based gas is used as an etch source, the surface polymer may be a CF-based polymer obtained by combining the fins F1 and F2 and/or the insulation layers 3120a and 3121 and the etch source. The first step (S11) may be referred to as an absorption step in which the formation of the surface polymer is relatively easy, and the second step (S12) may be referred to as a desorption step in which the formation of the surface polymer is relatively difficult.

The etching process may be performed by forming and removing the surface polymer. The surface polymer may be continuously formed and removed during the etching process. Thus, the thickness of the surface polymer may be determined by the ratio of the quantity of the formed surface polymer to the quantity of the removed surface polymer during the etching process. The surface polymer formed on the surface of the object to be etched in the more polymeric condition may be relatively thicker. That is, the object to be etched may be passivated by the thick surface polymer and etched at a relatively slower etching speed.

The surface polymer formed on the surface of the object to be etched in the less polymeric condition may be relatively thinner. That is, the object to be etched can be relatively rapidly etched since the thin surface polymer can be quickly removed from the object.

The first step (S11) and the second step (S12) according to embodiments can be implemented in various ways. As an exemplary embodiment, the first step (S11) and the second step (S12) can be determined by a difference in the duty ratio of RF bias. Hereinafter, a difference between the first step (S11) and the second step (S12) depending on the duty ratio of RF bias will be described in detail.

Figure 21:
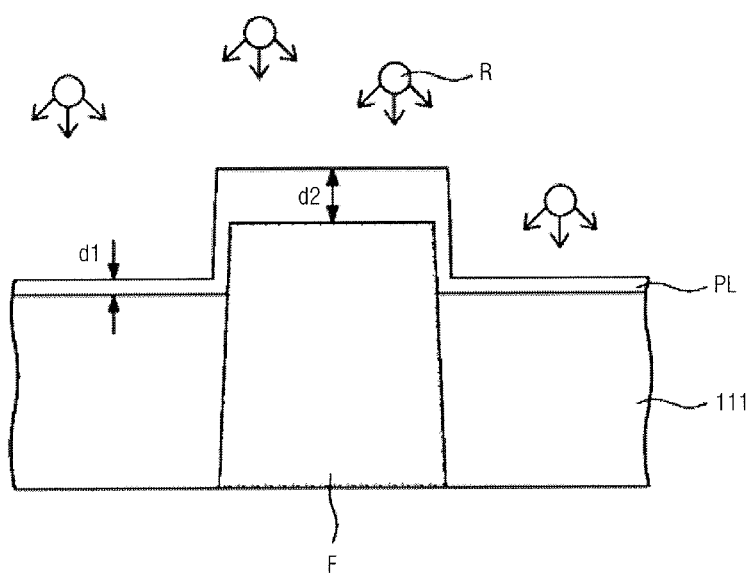
FIG. 21 illustrates a conceptual view of the first step (S11) according to embodiments.
Figure 22:
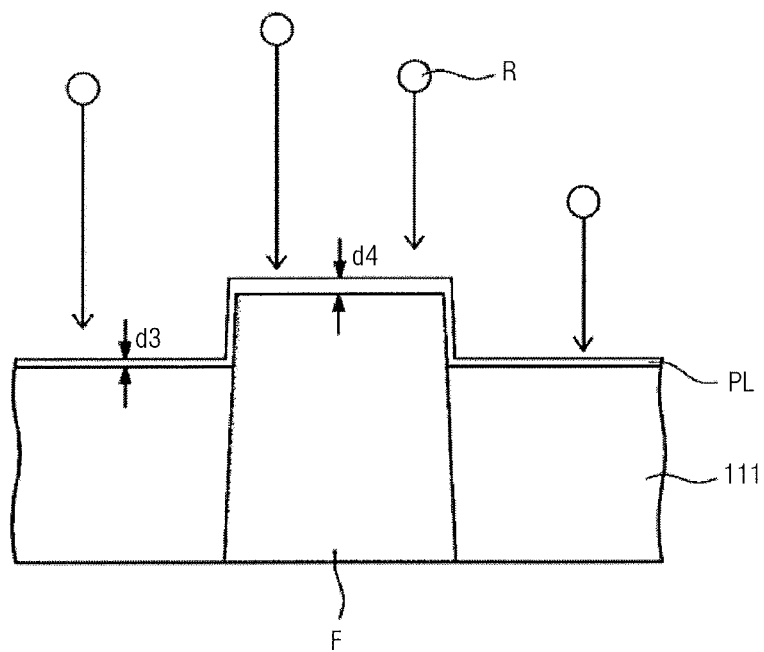
FIG. 22 illustrates a conceptual view of the second step (S12) according to embodiments.

FIG. 21 is a conceptual view of the first step (S11) according to embodiments and FIG. 22 is a conceptual view of the second step (S12) according to embodiments. The top portion of the fin F and the top portion of the insulation layer 111 may be exposed to active ions R in the chamber 10 shown in FIG. 18. In this case, the fin F may be the above-mentioned fins F1 and F2. Furthermore, the insulation layer 111 may be the above-mentioned first portion 111 of the field insulation layer 110, and in the present embodiment, the etching process applied to the insulation layer 111 can also be applied in the same way to the above-mentioned second portion 112 of the field insulation layer 110.

A method for controlling the ratio between the top width TCD and the bottom width BCD of the fins F1 and F2 according to embodiments will be described in more detail. Although the method for controlling the ratio between the top width TCD and the bottom width BCD of the fins F1 and F2 according to the present embodiment will be illustrated by way of example. Further, the method can be applied in the substantially same way to the method for controlling the ratio of the first width TW to the second width BW of the second insulation layer 112_2.

A part of the active ions R may be bonded to the top portion of the fin F and the top portion of the insulation layer 111 so as to form a surface polymer PL on the fin F and the insulation layer 111. When the fin F includes silicon and the insulation layer 111 includes an oxide layer, the insulation layer 111 containing oxygen and a part of the active ions R can be bonded into a CO and/or $CO_2$ form. Thus, in case of the exposed surface of the insulation layer 111, the bonded active ions can be relatively easily separated from the surface of the object to be etched than the active ions bonded onto the top surface of the fin F. Resultantly, the etching speed of the insulation layer 111 may be higher than the etching speed of the fin F.

Referring to FIG. 21, in the first step (S11) in which the duty ratio of RF bias is relatively lower than that in the second step (S12), which will be described hereinafter, the active ions R may have relatively low linearity toward the wafer including the fin F and the insulation layer 111 because of the low duty ratio. As an exemplary embodiment, the duty ratio in the first step (S11) may range from approximately 60% to approximately 80%. That is, the active ions R may include a large amount of cations of low energy having a large angular distribution. As described above, the insulation layer 111 containing oxygen may be bonded to the active ions R, and easily separated from the surface of the object to be etched, and thus the surface polymer PL may be formed into the first thickness d1 which is relatively thin on the surface of the insulation layer 111 during the etching process. However, the surface polymer PL may be formed into the second thickness d2 which is relatively thick on the surface of the fin F because of the relatively low duty ratio of RF bias. Accordingly, the fin F having the relatively thick surface polymer PL may have a lower etching speed, and the insulation layer 111 may have a relatively higher etching speed. That is, the etch selectivity of the insulation layer 111 may be higher relatively to the fin F in the first step (S11).

Referring to FIG. 22, the duty ratio of RF bias in the second step (S12) may be relatively higher than that in the first step (S11). As an exemplary embodiment, the duty ratio in the second step (S12) may be 1.1 to 1.7 times higher than the duty ratio in the first step (S11). As an exemplary embodiment, the duty ratio in the second step (S12) may be approximately 80% to approximately 100%. In the second step (S12), the active ions R may have relatively high linearity toward the wafer including the fin F and the insulation layer 111 due to the high duty ratio. That is, the active ions R may include a large amount of cations of high energy having a small angular distribution. Thus, the surface polymer PL having a fourth thickness d4 thinner than the second thickness d2 of the first step (S11) due to the high duty ratio of RF bias may be formed on the fin F. In the second step (S12), the surface polymer PL formed on the insulation layer 111 may have a third thickness d3 thinner than the fourth thickness d4. As an exemplary embodiment, the third thickness d3 may be approximately 10% to 30% thinner than the fourth thickness d4. The third thickness d3 may be thinner than the first thickness d1.

The fourth thickness d4 may be thicker than the third thickness d3, but a difference between the third thickness d3 and the fourth thickness d4 may be smaller than a difference between the first thickness d1 and the second thickness d2, and the thickness d3 and d4 of the surface polymer PL formed in the second step (S12) may not be sufficient to suppress the insulation layer 111 and the fin F from etching.

Resultantly, the etch selectivity of the insulation layer 111 to the fin F may be lower in the second step (S12) than in the first step (S11). The etching speed of the first insulation layer 111 may be relatively higher in the second step (S12) than in the first step (S11) due to the duty ratio of RF bias.

In the embodiments, the first step (S11) and the second step (S12) may be repeated a plurality of times. The first step (S11) may have high etch selectivity but relatively lower etching speed for the first insulation layer 111, and the second step (S12) may have low etch selectivity but relatively higher etching speed for the first insulation layer 111. According to embodiments, since two steps having different etching process conditions may be repeated, large process windows can be built as compared with a non-cyclic etching process. Furthermore, etch selectivity can be improved without sacrificing the etching speed for the insulation layer 111, thus preventing excessive loss of the fin F to be used as a channel region of a transistor later. That is, the ratio of top width (TCD) to bottom width (BCD) (top/bottom CD ratio) of the fin F can be improved.

That is, as the first step (S11) and the second step (S12) are repeated a plurality of times, the ratio of top width (TCD) to bottom width (BCD) of the fin F can be improved, and the ratio of top width (TCD) to bottom width (BCD) of the fin F may exceed at least 0.5. When the first step (S11) and the second step (S12) is repeated three or more times, the ratio of top width (TCD) to bottom width (BCD) of the fin F may reach approximately 0.6 or higher.

Furthermore, the respective numbers of repetitions of the first step (S11) and the second step (S12) can be controlled so as to control the ratio of the first width TW of the second insulation layer 112_2 to the second width BW thereof, and the ratio of the first width TW to the second width BW may be 0.9 or higher. For example, when the first step (S11) and the second step (S12) are repeated one time, the ratio of the first width TW to the second width BW may be 0.9 or higher, and the ratio of the first width TW to the second width BW may be closer to 1 as shown in FIG. 16. When the first step (S11) and the second step (S12) are repeated two or more times, the ratio of the first width TW to the second width BW may exceed 1 as shown in FIG. 17.

In the embodiments, the first step (S11) and the second step (S12) may be performed under other different process conditions as well as under the condition of different duty ratios. As an exemplary embodiment, the first step (S11) may be performed under a relatively higher chamber pressure, and the second step (S12) may be performed under a relatively lower chamber pressure. The chamber pressure in the first step (S11) may range from 14 to 21 mTorr, and the chamber pressure in the second step (S12) may range from 7 to 14 mTorr.

The first step (S11) may be an etching step using a first etch source having a high carbon to fluorine (C/F) ratio, and the second step (S12) may be an etching step using a second etch source having a low C/F ratio. As an exemplary embodiment, the first etch source may have a C/F ratio of ½ or higher, and the second etch source may have a C/F ratio lower than ½. As an exemplary embodiment, the first etch source may have $C_4F_6$(C/F ratio=:1:1.5), the second etch source may have $C_4F_8$(C/F ratio=1:2.0), $C_2F_6$(C/F ratio=1:3.0), and $CF_4$ (C/F ratio=1:4.0). The second step (S12) may have RF bias and/or RF power relatively lower than those of the first step (S11). As an exemplary embodiment, the first step (S11) may have source RF power of 1000 to 2000 W, and the second step (S12) may have source RF power of 2000 to 3000 W. The first step (S11) may have bias RF power of 0 to 500 W, and the second step (S12) may have bias RF power of 500 to 1000 W.

Figure 23:
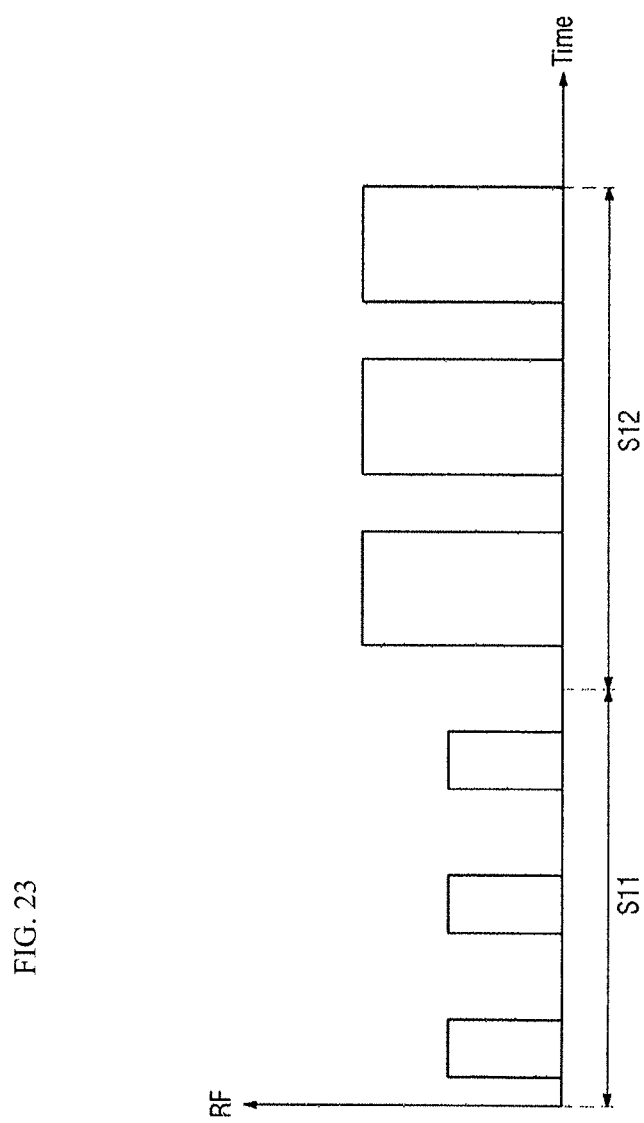
FIG. 23 and FIG. 24 illustrate graphical representations of the RF bias and duty ratio of the first step (S11) and the second step (S12) according to embodiments.
Figure 24:
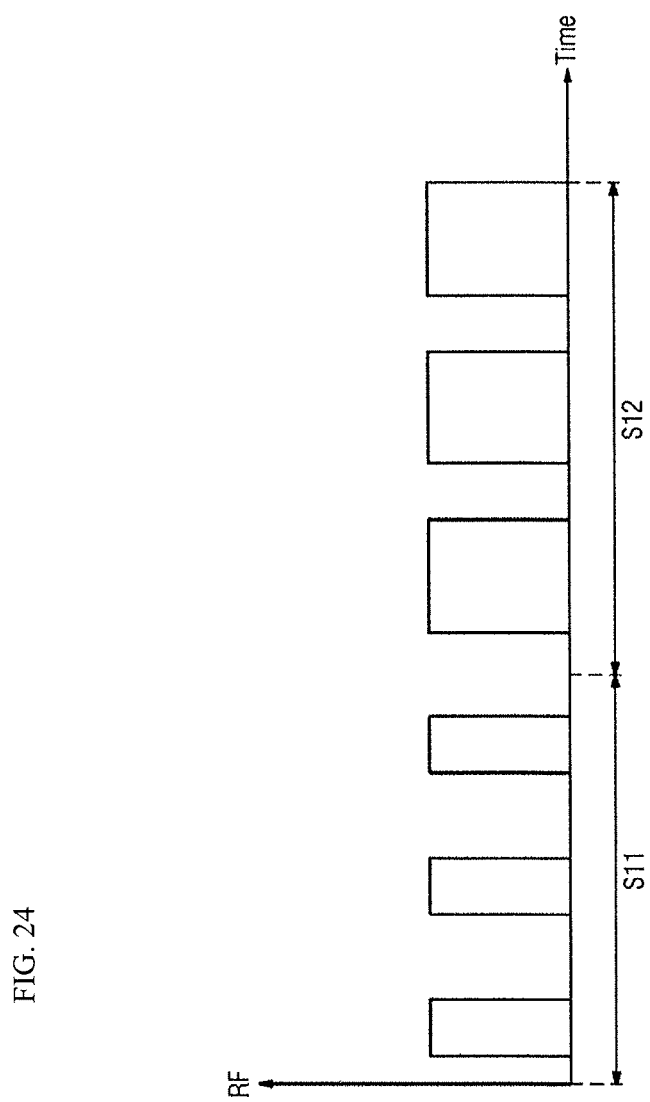

FIG. 23 and FIG. 24 are graphical representations illustrating the RF bias and duty ratio of the first step (S11) and the second step (S12) according to embodiments.

Referring to FIG. 23, the first step (S11) may have a relatively lower duty ratio of RF bias, and the second step (S12) may have a relatively higher duty ratio of RF bias. X axis may correspond to time, and Y axis may correspond to RF bias and/or RF power. The first step (S11) and the second step (S12) may be repeated a plurality of times. Thus, the first step (S11) may be performed under the more polymeric condition, and the second step (S11) may be performed under the less polymeric condition. In the present embodiment, the RF bias and/or RF power of the first step (S11) and the second step (S12) may be substantially the same.

Referring to FIG. 24, the second step (S12) may have RF bias and/or RF power larger than those in the first step (S11). The duty ratio in the second step (S12) may be larger than that in the first step (S11), or the duty ratio in the second step (S12) may be substantially the same as that in the first step (S11).

Figure 25:
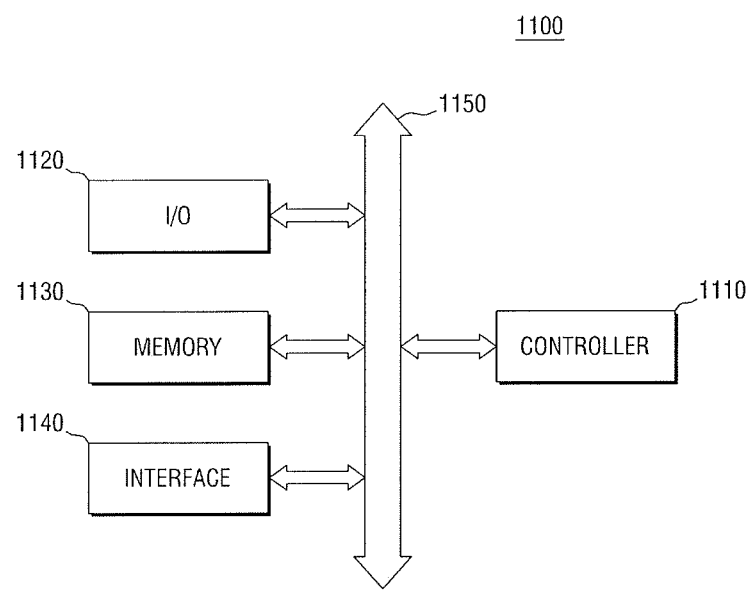
FIG. 25 illustrates a block diagram of an electronic system including semiconductor devices according to some.
Figure 26:
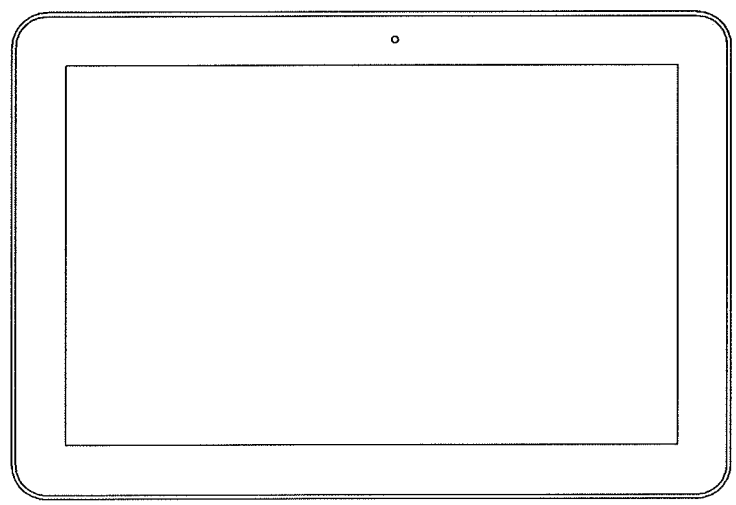
FIG. 26 illustrates an example of a semiconductor system to which semiconductor devices according to some embodiments can be applied.

FIG. 25 is a block diagram of an electronic system including semiconductor devices according to some embodiments. Referring to FIG. 26, an electronic system 1100 according to embodiments may include a controller 1110, an input/output (I/O) device 1120, a memory device 1130, an interface 1140, and a bus 1150. The controller 1110, the input/output device 1120, the memory device 1130 and/or the interface 1140 may be coupled with each other through the bus 1150. The bus 1150 may serve as a path for data movement.

The controller 1110 may include at least one of a microprocessor, a digital signal processor, a microcontroller, and logic elements capable of performing functions similar to those of the microprocessor, the digital signal processor, and the microcontroller. The input/output device 1120 may include a keypad, a keyboard, a touch screen, a mouse, and the like. The memory device 1130 may store therein data and/or instructions, and the like. The interface 1140 may perform the function of transmitting data to a communication network or receiving data from the communication network. The interface 1140 may be of a wired or wireless type. For example, the interface 1140 may include an antenna, a wired/wireless transceiver or the like. Although not shown in the drawings, the electronic system 1100 may further include high speed DRAM and/or SRAM as an operation memory for improving an operation of the controller 1110. The semiconductor device according to some embodiments may be provided within the memory device 1130, or provided as a part of the controller 1110, the input/output device 1120, and the like.

The electronic system 1100 can be applied to a personal digital assistant (PDA), a portable computer, a web tablet, a wireless phone, a smart phone, a mobile phone, a digital music player, a memory card, or all electronic products that can transmit and/or receive information in a wireless environment.

FIG. 26 illustrates an example of a semiconductor system to which semiconductor devices according to some embodiments can be applied. FIG. 25 illustrates a tablet PC. The semiconductor devices manufactured according to some embodiments of can be employed in a tablet personal computer, a notebook computer and the like. It may be readily apparent to those skilled in the art that the semiconductor devices manufactured according to some embodiments can also be applied to other integrated circuit devices which are not illustrated herein.

By way of summation and review, embodiments may provide fins having a ratio of the top width to the bottom width of greater than 0.5, e.g., up to 1. Embodiments may also provide an isolation region between fins having an upper portion on a lower portion, with the upper portion forming a tuck shape with the source/drain regions adjacent thereto. Embodiments may also provide isolation regions between fins that are wider than a dummy gate thereon.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a first fin and a second fin on a substrate; and
   a field insulation layer between the first fin and the second fin, and including a first insulation layer and a second insulation layer on the first insulation layer and connected to the first insulation layer, the second insulation layer having a width wider than a width of the first insulation layer,
   wherein a ratio of a top width to a bottom width of each of the first fin and the second fin exceeds 0.5, and
   wherein the second insulation layer includes a bottom surface having a second width, and a top surface facing the bottom surface and having a first width, and the second width being wider than the first width.

2. The semiconductor device as claimed in claim 1, wherein the second insulation layer includes a curved sidewall connecting the top surface and the bottom surface.

3. The semiconductor device as claimed in claim 1, further comprising a gate formed on the first fin, and a dummy gate formed on the field insulation layer.

4. The semiconductor device as claimed in claim 3, further comprising an elevated source/drain formed in the first fin between the gate and the dummy gate.

5. The semiconductor device as claimed in claim 4, wherein the second insulation layer contacts the source/drain.

6. The semiconductor device as claimed in claim 5, wherein a part of the source/drain is disposed beneath the second insulation layer.

7. The semiconductor device as claimed in claim 1, wherein a top surface of the second insulation layer and a top surface of the first fin are disposed on a same plane.

8. A semiconductor device, comprising:
   a first fin and a second fin protruding on a substrate and including respective longer sides and shorter sides, the shorter side of the first fin and the shorter side of the second fin being spaced apart from each other to face each other;
   a field insulation layer extending between the shorter side of the first fin and the shorter side of the second fin;
   a gate extending on the first fin to intersect the first fin;
   a dummy gate on the field insulation layer; and
   a source/drain in the first fin between the gate and the dummy gate,
   wherein each of the first fin and the second fin has a ratio of a top width to a bottom width measured along the shorter side of each of the first fin and the second fin exceeds 0.5,
   wherein the field insulation layer includes a first insulation layer and a second insulation layer formed on the first insulation layer and having a width wider than a width of the first insulation layer, and
   wherein the second insulation layer includes a bottom surface having a second width, and a top surface facing the bottom surface and having a first width, and the second width is greater than the first width.

9. The semiconductor device as claimed in claim 8, wherein the second insulation layer includes a curved sidewall connecting the top surface and the bottom surface.

10. The semiconductor device as claimed in claim 8, wherein a part of the source/drain is disposed beneath the second insulation layer.

11. The semiconductor device as claimed in claim 8, wherein the second insulation layer contacts the source/drain.

12. A semiconductor device, comprising:
    a first fin and a second fin protruding from a substrate and including respective longer sides and shorter sides, the shorter side of the first fin and the shorter side of the second fin being spaced apart from each other to face each other;
    a field insulation layer between the shorter side of the first fin and the shorter side of the second fin, the field insulation layer including a first insulation layer and a second insulation layer on the first insulation layer;
    a gate on the first fin to intersect the first fin;
    a dummy gate on the field insulation layer; and
    a source/drain in the first fin between the gate and the dummy gate,
    wherein the second insulation layer is wider than the first insulation layer and a portion of the source/drain is below the second insulation layer, and
    wherein the second insulation layer includes a bottom surface having a second width, and a top surface facing the bottom surface and having a first width, and the second width being greater than the first width.

13. The semiconductor device as claimed in claim 12, wherein an upper surface of the second insulation layer is wider than the dummy gate.

14. The semiconductor device as claimed in claim 12, wherein an upper surface of the second insulation layer is wider than the first fin.

15. The semiconductor device as claimed in claim 12, wherein the first fin and the second fin contact the first insulation layer.

16. The semiconductor device as claimed in claim 12, wherein a portion of the first insulation layer extends beyond the shorter sides of the first and second fins.

* * * * *